(12) United States Patent
Brigance

(10) Patent No.: US 11,054,452 B2
(45) Date of Patent: Jul. 6, 2021

(54) EMC ANTENNA SYSTEM WITH AUTOMATED TUNING FEATURE

(71) Applicant: SteppIR Communication Systems Inc., Bellevue, WA (US)

(72) Inventor: Yuri Alex Brigance, Kirkland, WA (US)

(73) Assignee: SteppIR Communication Systems Inc., Bellevue, WA (US)

( * ) Notice: Subject to any disclaimer, the term of this patent is extended or adjusted under 35 U.S.C. 154(b) by 161 days.

(21) Appl. No.: 16/517,433

(22) Filed: Jul. 19, 2019

(65) Prior Publication Data

US 2021/0018547 A1 Jan. 21, 2021

(51) Int. Cl.
*G01R 29/08* (2006.01)
*H01Q 3/26* (2006.01)
*H01Q 3/44* (2006.01)

(52) U.S. Cl.
CPC ......... *G01R 29/0821* (2013.01); *H01Q 3/267* (2013.01); *H01Q 3/446* (2013.01)

(58) Field of Classification Search
None
See application file for complete search history.

(56) References Cited

U.S. PATENT DOCUMENTS

| | | | |
|---|---|---|---|
| 4,970,524 A * | 11/1990 | Hens | H01Q 9/36 343/707 |
| RE42,087 E | 2/2011 | Mertel | |
| 8,963,560 B2 | 2/2015 | Mertel et al. | |
| 10,520,534 B1 * | 12/2019 | Rowell | H01Q 1/526 |
| 2004/0203447 A1 * | 10/2004 | Lee | H04B 17/0085 455/67.11 |
| 2015/0120189 A1 * | 4/2015 | Giometti | H01Q 1/50 701/522 |
| 2016/0252554 A1 * | 9/2016 | Opitz | G01R 1/04 324/612 |

FOREIGN PATENT DOCUMENTS

WO WO-2015139466 A1 * 9/2015 ............. G01R 29/10

* cited by examiner

*Primary Examiner* — Amy Cohen Johnson
*Assistant Examiner* — James H Cho
(74) *Attorney, Agent, or Firm* — Glass and Associates; Kenneth D'Alessandro; Kenneth Glass

(57) ABSTRACT

A method for operating an electromagnetic compatibility testing system includes for selected frequencies, adjusting incrementally the lengths of each of the plurality of length-adjustable elements for selected combinations of length ratios between the driven element and other length-adjustable elements, including length ratios where the driven element is longer than the other length-adjustable elements, for each selected frequency storing in a table one of the incremental lengths at one of the selected combinations of length ratios having one of the lowest VSWR and a VSWR lower than a threshold value that has highest signal strength, for each selected frequency adjusting the lengths of each of the length-adjustable elements to the stored lengths, driving RF energy at the selected frequency at a EMC test power level into the EMC antenna generating an e-field in the equipment under test, and measuring behavior of the equipment under test in the presence of the e-field.

17 Claims, 11 Drawing Sheets

EMC ANTENNA SYSTEM WITH AUTOMATED TUNING FEATURE

The present invention relates to antenna systems. More particularly, the present invention relates to antenna systems that are particularly useful for electromagnetic compatibility (EMC) testing. More particularly, the present invention relates to an EMC antenna system having an automated tuning feature.

BACKGROUND

EMC testing systems are known in the art. EMC testing is used for radiation and susceptibility testing of electronic devices. Radiation testing is used to determine how much radio frequency (RF) energy is radiated by electronic devices while they are operating. In the radiation mode of testing, the antenna is used as a receive antenna. Susceptibility testing is used to determine how much RF energy a device can be exposed to before it malfunctions. In the susceptibility mode of testing, the antenna is used as a transmitting antenna.

Susceptibility testing starts at 30 MHz and at that frequency a very large shielded room is required to accommodate a reasonably efficient antenna such as a half wave dipole, which is 16 feet wide at this frequency. These rooms are not practical for the vast majority of test facilities. In addition, because the testing is performed at frequencies up to at least several hundred megahertz, the presently-available antenna systems must be broadbanded enough to operate over these ranges.

One type of presently-available broadband EMC antennas used for susceptibility testing include bi-conical antennas and log periodic arrays. Such antennas are inefficient and can also be expensive. These antennas are paired with RF amplifiers in EMC systems the total cost of which can exceed $500K to $700K. Because presently-available systems are so inefficient, the amplifiers have to be run at extremely high power levels (e.g., in excess of 5KW). At such power levels, coupled with extreme impedance mismatches between the amplifier and antenna, the EMC antenna sometimes radiates more energy at the second or third harmonic than at the fundamental frequency of interest. This setup badly skews the test results and often renders them invalid according to the existing testing standards.

Other antennas such as e-field radiators, also known as billboard antennas, are sometimes used for susceptibility testing but cannot totally illuminate the device under test. These antennas are thus very inefficient because the test must be repeated. In addition, the test cannot always be performed according to the existing testing standards.

Recently, an EMC antenna system having a multi-element antenna that can be tuned by adjusting the lengths of the antenna elements has become available. Such a system is described in U.S. Pat. No. 8,963,560 to Mertel et al. and employs length-adjustable antenna elements similar to those described in U.S. Pat. No. RE42,087.

Typical reiterative software algorithms are designed to maximize performance of complex systems involving many variables. The usual approach is to vary the adjustable system parameters based on preprogrammed strategies, guided by human expert knowledge, and then pursue the strategy that looks most likely to obtain the best result. In the context of the present invention, the problem is directed to maximizing the e-field emanating from an adjustable antenna located in a metal chamber sealed against RF leaking out of it. The purpose of this chamber is to prevent RF energy from escaping and disrupting communications over broad swaths of the frequency spectrum. Unfortunately, generating the required high intensity e-fields in this environment is extremely difficult because it drastically reduces the ability of any antenna placed in the chamber to create these fields. The number of variables that result from placing an antenna in a metal chamber are so numerous that they are virtually impossible to manage. The variability arises from numerous sources, including but not limited to the Equipment Under Test (EUT), chamber dimensions, and reflectivity/adsorption of RF (which is frequency dependent). A significant problem is that in this environment the antenna no longer reacts in a logical fashion, and in fact does not act like any normal antenna from 30 MHz to about 100 MHz. This antenna behavior has resulted in previous tuning systems simply unable to find element lengths that would result in both satisfactory RF field strengths and acceptable standing wave ratio (SWR) for EMC testing. There is simply no logic to the tuning that results in both an acceptable SWR and the required field intensity.

BRIEF DESCRIPTION

The methods of the present invention are implemented after certain preconditions are established. An oscillating RF signal source is set to oscillate at a particular frequency and the oscillating RF signal is amplified via an amplifier or other means. The amplified oscillating signal is connected to the EMC antenna and the lengths of the EMC antenna elements are extended to pre-set lengths. The test article(s) (or field probe(s)) is/are positioned some distance away from the EMC device.

The set of element lengths is considered optimal if the Voltage Standing Wave Radio (VSWR) measurement is below a user-defined constant (for example: 1.75), and the selected element lengths produce the maximum possible emitted RF field strength as measured at the position of the text article or field probe.

According to an aspect of the invention, a method for operating an electromagnetic compatibility testing system includes providing in an EMC test chamber an EMC antenna having a plurality of length-adjustable elements one of which is a driven element, selecting a plurality of frequencies within an EMC testing frequency range, separately for each of the plurality of selected frequencies, adjusting individually incrementally the lengths of each of the plurality of length-adjustable elements for selected combinations of length ratios between the driven element and other ones of the plurality of length-adjustable elements, including combinations of length ratios where the driven element is longer than the other ones of the plurality of length-adjustable elements, separately for each of the incremental lengths of each of the plurality of length-adjustable elements in the selected combinations of length ratios and for each of the plurality of selected frequencies, driving RF energy at the selected frequency at a calibration power level into the driven element of the EMC antenna and measuring VSWR and signal strength, separately for each of the plurality of selected frequencies, selecting and storing a one of the incremental lengths at a one of the selected combinations of length ratios having one of the lowest VSWR and a VSWR lower than a threshold value that exhibits a highest signal strength, placing an equipment under test in the EMC test chamber, separately for each of the plurality of selected frequencies, adjusting individually the lengths of each of the plurality of length-adjustable elements to the selected and stored lengths, driving RF energy at the selected frequency at a EMC test power level into the driven element of the EMC antenna to generate an e-field in the equipment under test, and measuring behavior of the equipment under test in the presence of the e-field.

According to an aspect of the invention, selecting a plurality of frequencies within the EMC testing frequency range comprises selecting a plurality of frequencies between 30 MHz and 200 MHz.

According to an aspect of the invention, adjusting individually incrementally the lengths of each of the plurality of length-adjustable elements comprises adjusting individually the lengths of each of the plurality of length-adjustable elements by increments of between about 1 inch and about 10 inches.

According to an aspect of the invention, adjusting individually incrementally the lengths of each of the plurality of length-adjustable elements comprises adjusting individually the lengths of each of the plurality of length-adjustable elements by increments of 1 inch.

According to an aspect of the invention, wherein adjusting individually incrementally the lengths of each of the plurality of length-adjustable elements comprises adjusting individually the lengths of each of the plurality of length-adjustable elements by increments of 5 inches.

According to an aspect of the invention, the plurality of length-adjustable elements includes a driven element and a reflector.

According to an aspect of the invention, the selected combinations of length ratios between the driven element and the reflector is 0.50, 0.66, 0.85, 1.01, and 1.15.

According to an aspect of the invention, the plurality of length-adjustable elements includes a director, a driven element and a reflector.

According to an aspect of the invention, with the length ratio between the driven element and the reflector at 0.95 and the selected combinations of length ratios between the driven element and the director is 0.90, 1.00, and 1.10, with the length ratio between the driven element and the reflector at 1.00 and the selected combinations of length ratios between the driven element and the director is 0.90, 1.00, 1.10, and with the length ratio between the driven element and the reflector at 1.05 and the selected combinations of length ratios between the driven element and the director is 0.90, 1.00, 1.10.

According to an aspect of the invention, driving RF energy at the selected frequency at a calibration power level into the driven element of the EMC antenna comprises driving RF energy at the selected frequency into the driven element of the EMC antenna at less than about 1 watt to about 100 watts.

According to an aspect of the invention, driving RF energy at the selected frequency at a EMC test power level into the driven element of the EMC antenna comprises driving RF energy at the selected frequency into the driven element of the EMC antenna at about 400 watts to about 2,000 watts.

According to an aspect of the invention, element length data stored in the table is augmented by interpolating adjacent element length values.

According to an aspect of the invention, an electromagnetic compatibility (EMC) testing system includes an EMC antenna having a plurality of length-adjustable elements one of which is a driven element, an antenna element length controller that adjusts individually incrementally the lengths of each of the plurality of length-adjustable elements for selected combinations of length ratios between the driven element and other ones of the plurality of length-adjustable elements, including combinations of length ratios where the driven element is longer than the other ones of the plurality of length-adjustable elements, a circuit for driving into the EMC antenna RF energy at a plurality of frequencies at a calibration power level within an EMC testing frequency range separately for each of the incremental lengths of each of the plurality of length-adjustable elements in the selected combinations of length ratios and for each of the plurality of selected frequencies and for measuring VSWR and signal strength, a controller configured to, select and store in a table a one of the incremental lengths at a one of the selected combinations of length ratios having one of the lowest VSWR and a VSWR lower than a threshold value that exhibits a highest signal strength at each of the frequencies, separately for each of the plurality of selected frequencies adjust individually the lengths of each of the plurality of length-adjustable elements to the selected and stored lengths, drive RF energy at the selected frequency at a EMC test power level into the driven element of the EMC antenna to generate an e-field in the equipment under test, and measure behavior of the equipment under test in the presence of the e-field.

According to an aspect of the invention, the EMC antenna has two length-adjustable elements.

According to an aspect of the invention, the EMC antenna has three length-adjustable elements.

According to an aspect of the invention, the controller is further configured to drive an oscillating RF signal source to one of the calibration power level and the EMC test power level.

According to an aspect of the invention, the oscillating RF signal source includes an amplifier and the controller is configured to disable the amplifier to drive the oscillating RF signal source to the calibration power level and to enable the amplifier to drive the oscillating RF signal source to the EMC test power level.

BRIEF DESCRIPTION OF THE DRAWING FIGURES

The invention will be explained in more detail in the following with reference to embodiments and to the drawing in which are shown:

DETAILED DESCRIPTION

Figure 1A:
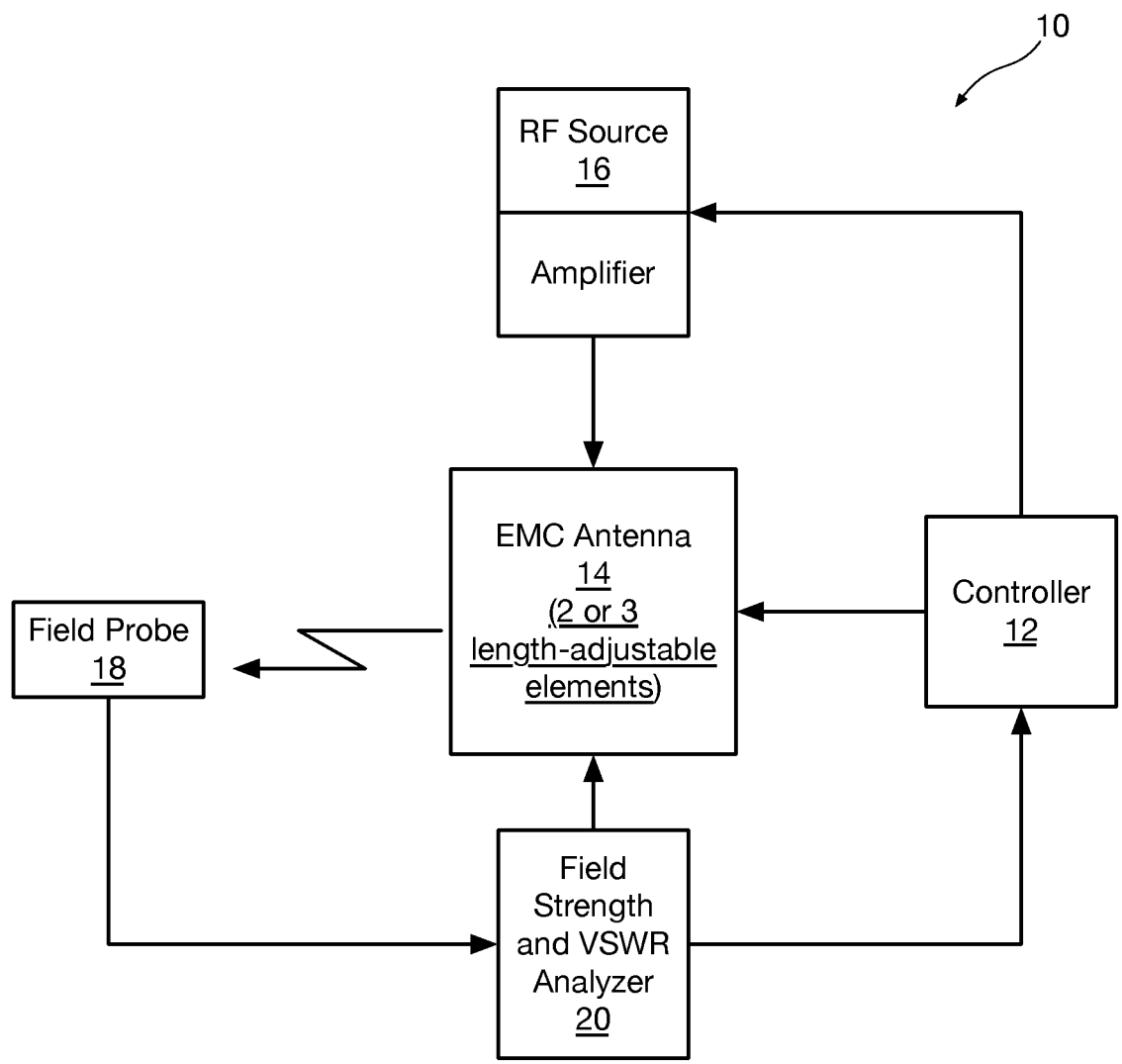
FIG. 1A is a block diagram of an EMC antenna system used to implement automatic tuning.

Persons of ordinary skill in the art will realize that the following description is illustrative only and not in any way limiting. Other embodiments will readily suggest themselves to such skilled persons.

The EMC antenna under discussion is a Yagi antenna and the elements have a well-known relationship, the lengths of the passive elements always fall between 3%-10% shorter or longer than the driven element. Inside the EMC testing chamber using the current invention it has been found that satisfactory results occasionally occur when the lengths of the passive elements vary as much as 0%-150% from the length of the driven element especially at the lower frequency ranges, clearly a result no one trained in the art would expect. If the behavior of the EMC antenna in the EMC test chamber exhibited just a few trends that could be incorporated into a classic algorithm then the present invention would have considerably less advantage over prior art, but it has been discovered that there are hundreds of inexplicable and unanticipated combinations that work.

In short, the present invention can identify element lengths that give satisfactory results that no human or existing algorithm can predict in a reasonable (under a few hours) amount of time. As a preliminary matter, the prior art has assumed an expected relationship between the relative lengths of director, driven element, and reflector antenna elements whereby the reflector is longer than the driven element and the director is shorter than the driven element. Automating a prior-art calibration process would proceed on the assumption that the combinations of antenna element lengths to be tested would follow this assumed relationship between the relative lengths of director, driven element, and reflector antenna elements.

It has been discovered that the behavior of a Yagi antenna in an EMC test chamber does not follow the expected relationship between the relative lengths of director, driven element, and reflector antenna elements. In fact, many of the optimum solutions of Yagi antennas that have been found to exist in EMC test chambers at certain frequencies within the EMC test frequency range include relative lengths of director, driven element, and reflector antenna elements where reflector and director elements are shorter than the driven element. In accordance with the present invention, a calibration method tests for solutions that utilize element lengths and ratios outside of those predicted by the prior art for all frequencies.

Randomly trying every element length and ratio to find a satisfactory combination would require an inordinate amount of time because each iteration requires physical movement of the elements followed by evaluation. There are 382 frequency segments, and elements can be extended from 0 inches to 230 inches (with the middle element extending from 0 inches to 100 inches). Systematically trying every element length and ratio to find a satisfactory combination would also require an inordinate amount of time. To test every element position against every frequency segment at a resolution of 1 inch would require 382*230*100*230=~2 Billion movements. Each movement and the accompanying measurement together take approximately 1-2 seconds. The result is that the approximate time required to test every element position against every frequency segment would amount to just over 128 years for a 3-element Yagi.

Referring first of all to FIG. 1A, an EMC testing system 10 includes a controller 12, which may be a device containing CPU, memory, and a set of control algorithms tailored to operate the equipment. This device may have a user interface, as well as an Application Programming Interface that allows it to be controlled by other devices. This device may also facilitate connectivity to the Cloud or locally via wired Ethernet, Wi-Fi, Cellular or any other means of connecting to the Internet such that clients (other PCs, mobile devices, web browsers, or other hardware peripherals) can connect to and control the equipment remotely. Such connectivity and control is well known in the art.

The controller 12 is coupled to an EMC antenna 14. The EMC antenna 14 may be an antenna having a plurality of length-adjustable elements. In one instance of the invention, the EMC antenna 14 may have three length-adjustable elements. The EMC antenna 14 may be configured as a two-element antenna by fully retracting the third length-adjustable element. The EMC antenna 14 may be an antenna such as the one described in U.S. Pat. No. 8,963,560 to Mertel et al., incorporated by reference herein in its entirety. The controller 12 adjusts the lengths of the length-adjustable elements. Control of length-adjustable elements of an antenna is known in the art and one way of adjusting the lengths of length-adjustable elements of an antenna is described, for example, in U.S. Pat. No. RE42,087 to Mertel, incorporated by reference herein in its entirety.

The controller 12 is also coupled to an RF source 16. The RF Source 16 is an oscillating RF source capable of producing RF signals (whether amplified or not) across a span of frequencies. The RF source 16 drives RF energy into the EMC antenna 14. In one instance of the invention, the RF source 16 may include an amplifier controlled by the controller 12 to disable the amplifier to drive the RF source 16 to a calibration power level and to enable the amplifier to drive the oscillating RF signal source to an EMC test power level higher than the calibration level to facilitate re-configuring the system between a calibration mode and an EMC testing mode as will be described herein.

One or more field probe(s) 18 capable of sensing RF fields emitted by the EMC device, ideally tuned to the specific frequencies being tested, are positioned at a distance from the EMC antenna 14 to sense RF energy emitted by the EMC antenna 14 as is known in the art. In one instance of the invention, the field probes may be National Institute of Standards and Technology (NIST) traceable probes necessary for the EMC testing that will be performed by the system.

A field strength and VSWR analyzer 20 is coupled to the EMC antenna 14 and to the output of the one or more field probes 18. The field strength and VSWR analyzer 20 is a device or a set of devices capable of taking field strength measurements from the field probe(s) 18 and VSRW measurements from the EMC device across a span of frequencies. The field strength and VSWR analyzer 20 is coupled to the controller 12 so that measured field strength and VSWR data can be downloaded to the controller 12.

The methods of the present invention are implemented after certain preconditions are established. The oscillating RF signal source 16 is set to oscillate at a particular frequency and the oscillating RF signal may be amplified via an amplifier or other means (not shown in FIG. 1A). The oscillating signal is coupled to the EMC antenna 14 and the lengths of the EMC antenna elements are extended to pre-set lengths. The test article(s) (or field probe(s)) 18 is/are positioned some distance away from the EMC antenna 14.

The set of element lengths is considered optimal if the VSWR measurement is below a user-defined constant (for example: 1.75:1), and the selected element lengths produce the maximum possible emitted RF field strength as measured at the position of the one or more field probe(s) 18.

Figure 1B:
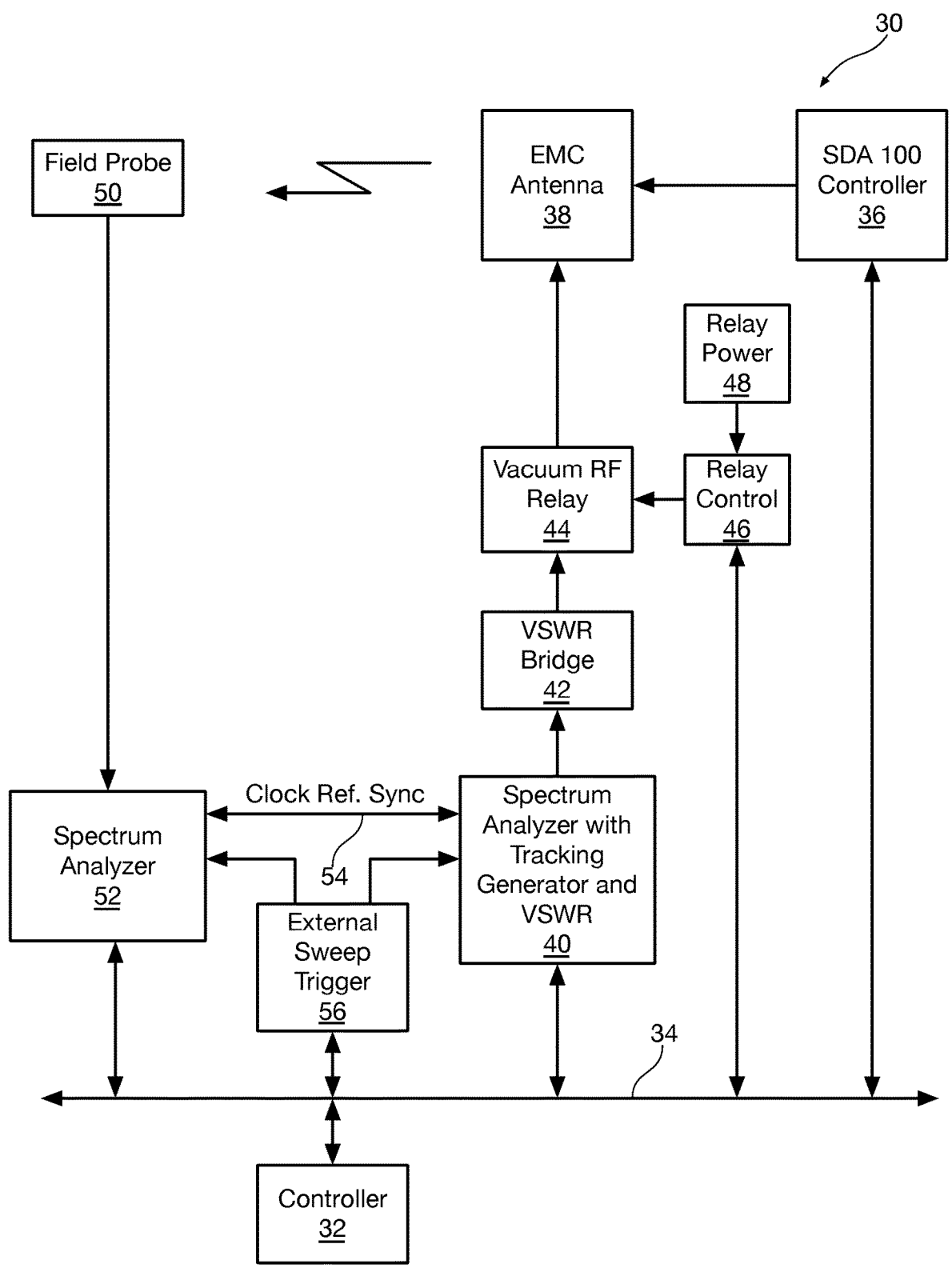
FIG. 1B is a block diagram showing a non-limiting illustrative example of a test setup for an EMC test system according to the present invention.

FIG. 1B is a block diagram showing a non-limiting illustrative example of a test setup 30 for an EMC test system according to the present invention. A controller 32 in the form of a PC or single board computer (SBC) that contains the tuning and control software. In accordance with an illustrative embodiment, a Raspberry Pi SBC running the Raspbian Stretch distribution of Linux was employed. The controller 32 communicates with the other elements of the system across a bus 34, which in one instance of the invention is a Universal Serial Bus (USB).

The controller 32 communicates across the bus 34 with an antenna-element length controller 36, which in one instance of the invention, may be a model SDA-100 antenna-element length controller available from Steppir Communications Systems of Bellevue, Wash. This antenna-element length controller 36 receives commands over the bus 34 from the controller 32 and translates them into stepper-motor signals which implement EMC element movements in the EMC antenna 38. A Serial to USB Adapter based on the FT232R chipset provided by Future Technology Devices International (FTDI) of Glasgow, Scotland available from a number of vendors allows the controller 32 to send serial commands to the SDA100 antenna element length controller 36 over the USB bus connection 34.

A spectrum analyzer 40 such as a Rigol DSA-815 spectrum analyzer available from Rigol Technologies of Beijing, China, having a tracking generator is used as the RF signal source to create an oscillating RF signal that sweeps across a specified frequency span. This oscillating RF signal is used to drive the EMC antenna 38 through VSWR bridge 42 (e.g., a Rigol Technologies VB1080 VSWR bridge) and vacuum relay 44.

The vacuum relay 44 is controlled by a relay control circuit 46 taking power from a relay power supply 48. The relay control circuit 46 may be a relay provided in the SDA100 antenna element length controller or may be external to the SDA100 antenna element length controller and is controlled by the controller 32 over the bus 34.

The Rigol DSA-815 spectrum analyzer 40 is also configured by an available software option to measure VSWR sensed by the VSWR bridge 42 (e.g., using a Rigol Technologies DSA800-VSWR VSWR measurement kit).

RF energy emitted by the EMC antenna 38 is sensed by the field probe 50 for measurement. Tests reported in this application were performed using a suitable reference antenna acting as a field strength probe. A second spectrum analyzer 52 such as a Rigol DSA-815 spectrum analyzer 52 is used to measure field strength only. Its clock reference is synced to the spectrum analyzer 40 via a clock reference sync coaxial cable indicated at reference numeral 54.

The vacuum relay 44 is used to open and close the connection between the EMC antenna 38 and the DUT port of the VSRW bridge 42 for the purposes of initial VSWR calibration. The spectrum analyzer 40 requires that reflectance be measured prior to measuring Return Loss (RL) and VSWR. In order to do this, the DUT port of the VSWR bridge 42 must be open when measuring reflectance. Then the DUT port of the VSWR bridge 42 must be re-connected to measure RL and SWR. The vacuum relay 44 is capable of opening and closing the connection between the EMC antenna 38 and the VSWR bridge 42 and is used in order to facilitate automatic VSWR calibration. The relay control 46 is used solely to programmatically control the opening and closing of the vacuum RF relay 44 for the purposes of connecting and disconnecting the EMC antenna 38 from the DUT port of the VSWR bridge 42 during calibration.

The spectrum analyzers 40 and 52 have to begin their sweeps at the same time (and must have their reference clocks synchronized) in order to measure the VSWR and signal strength across the entire frequency span. The external sweep trigger 56 acts as an external trigger, connected to both spectrum analyzers 40 and 52, that allows the controller 32 to issue a command to trigger both spectrum analyzer sweeps at the same time. Persons of ordinary skill in the art will appreciate that the external sweep trigger 56 can be replaced with any other device capable of generating a pulsed 5-volt signal, for example by using general purpose input/output (GPIO) pins on the Raspberry Pi SBC.

In accordance with one aspect of the present invention, the EMC antenna itself, as includes length-variable elements, referred to herein as M1, M2, and M3. Persons of ordinary skill in the art will appreciate that other numbers of elements could be employed in EMC antennas in different embodiments of the invention. Which of the three elements are used depends on which frequency segment is currently selected. In one example instance of the invention, Table 1 shows the use of the three antenna elements and their functions as a function of the frequency range under examination. The segment numbers refer to the number of discrete frequencies within the frequency ranges at which measurements are taken. In the particular embodiment of the invention shown in Table 1, 382 segments are used. Persons of ordinary skill in the art will appreciate that embodiments of the invention using a different number of segments, a different number of frequency ranges and a different distribution of segments among the frequency ranges are contemplated to fall within the scope of the present invention.

TABLE 1

| Segment Numbers | Frequency Range | Element Function |
|---|---|---|
| 1-122 | 30 MHz-55 MHz | M1: Driven<br>M2: Not used<br>M3: Reflector |
| 123-382 | 55 MHz-200 MHz | M1: Director<br>M2: Driven<br>M3: Reflector |

The tuning procedure in accordance with the present invention is designed to automatically determine the optimal set of element lengths for the given frequency. The tuning procedure may be viewed as including three stages. The first stage is setup and calibration, the second stage is measurement, and the third stage is data analysis.

Figure 2:
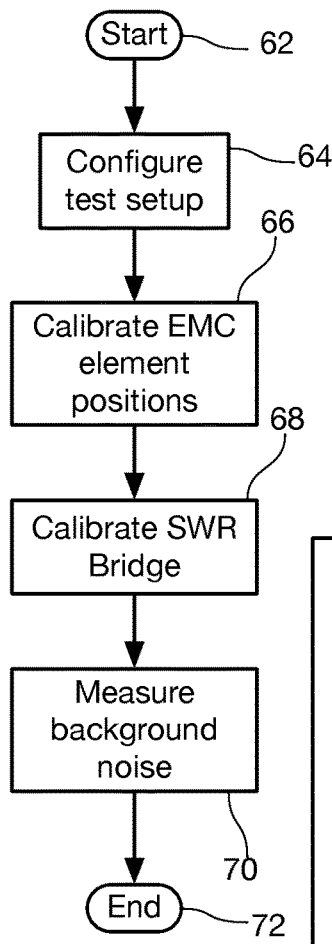
FIG. 2 is a flow diagram of a method used to perform EMC antenna element and measuring equipment calibration in accordance with an aspect of the present invention.

Before beginning the tuning procedure, the system equipment is set up for measurement. Referring now to FIG. 2, a flow diagram shows an illustrative setup and calibration procedure 60 that may be employed using the concepts of the present invention. The procedure begins at reference numeral 62.

At reference numeral 64, the system test setup is configured by positioning the various system components in the EMC chamber and interconnecting them together, e.g., as shown and described with reference to the illustrative embodiments of FIG. 1A and FIG. 1B. It is preferable but not necessary at this time to position the equipment under test (EUT) in its test position in the EMC chamber. Persons of ordinary skill in the art will appreciate that calibrating the system prior to positioning the EUT may result in non-optimal calibration.

At reference numeral 66, EMC antenna Element Position Calibration is performed. This step is performed by sending a calibration command to the SDA100 antenna element length controller.

At reference numeral 68, the VSWR bridge is calibrated. To use the VSWR measurement option of the Rigol DSA-815 spectrum analyzer 40 of FIG. 1B, the analyzer is controlled programmatically using, for example, the National Instruments Virtual Instrument Software Architecture (NI-VISA) application programming interface (API) and a USB connection. The frequency span and resolution bandwidth are set as necessary for the specific frequency segments being measured. The EMC antenna is disconnected from the DUT port of the VSRW Bridge 42 by sending a command from the controller 32 to the relay control 46. This will de-energize the vacuum RF relay 44, thus disconnecting the EMC antenna 38 from the DUT port of the VSRW Bridge 42. The reflectance across the entire frequency spectrum is measured and stored. This is done by sending a "Cal Open" command to the Rigol Analyzer. A command is sent to the relay control 46 to re-energize the vacuum RF relay 44. This re-connects the EMC antenna 38 to the DUT port of the VSWR bridge 42. A sweep is then triggered to measure return loss.

Two traces displayed on the Rigol DSA-815 analyzer screen include a reference (reflectance) trace, and a return loss trace, which is what is used by the analyzer to calculate Reflection Coefficient and VSWR.

At reference numeral 70, signal background noise is measured. Before measuring signal gain (above background) the background noise in the EMC chamber needs to be measured as a reference. The frequency span and resolution bandwidth of the spectrum analyzer 52 is set as necessary for the specific frequency segments being measured. With the tracking generator of the spectrum analyzer 40 disabled, a set of measurements is taken from the field probe 50 across the entire frequency span. The measurements are averaged and stored. The tracking generator is then re-enabled. If a Rigol DSA-815 is used two traces will be displayed. The first trace is the background noise of the chamber, and the second trace is the signal gain—the RF field generated by the tracking generator in the other spectrum analyzer and emitted from the EMC antenna 38 as captured by the field probe antenna.

Figure 3:
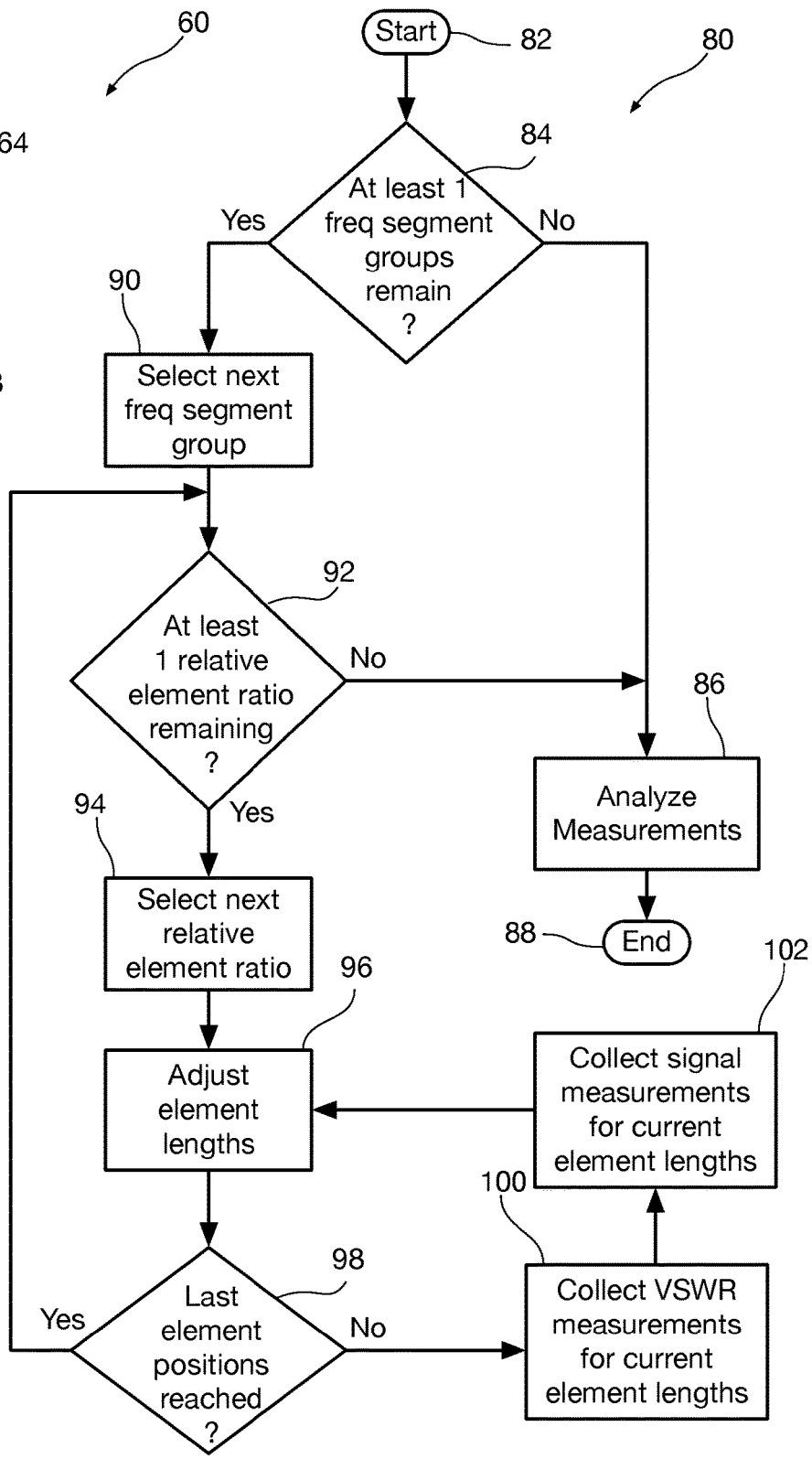
FIG. 3 is a flow diagram showing a method for performing the measurement phase of a method in accordance with an aspect of the present invention.

A representative method 80 implementing the measurement stage of the tuning procedure is illustrated in the flow diagram of FIG. 3. The tuning algorithm performs measurements by changing the driven element length by a configurable distance (for example 1 inch) and taking the VSWR and Signal Gain measurements for the entire frequency spectrum at each length. As the length of the driven element is being changed, the other element lengths are also being updated. The lengths of the other elements (example: director, reflector) depends on the current ratio, where that ratio is defined as a percentage of the length of the driven element. It has been found that increments between about 1 inch and 10 inches are operable at lower frequencies. Persons of ordinary skill in the art will appreciate that the increments will be smaller at higher frequencies.

In order to better understand the ratio concept described herein, example reflector lengths are provided for a given driven length. As a non-limiting example, assume that the current frequency span requires the use of 2 elements (driven element and reflector). The driven element lengths will be moved 1 inch at a time from 230 inches down to 90 inches. Assume that the current reflector ratio is set to 0.5, which means that the length of the reflector element is set to be 50% of the driven length. When the length of the driven is set to 200 inches, the length of the reflector will be set to 100 inches. When the length of the driven is set to 100 inches, the length of the reflector will be set to 50 inches, and so on.

The method performs multiple passes based on the starting and ending ratios of the "supporting" elements (director, reflector, etc.). The starting and ending ratios and the number of ratios is user-configurable.

As a non-limiting example, using the above two-element configuration, the user can specify that the reflector length should be at minimum 50% of the driven length, and at maximum 115% of the driven length, and that 5 samples should be taken. In this scenario, the algorithm will take measurements at every one-inch increment of the driven element length at the following 5 reflector ratios: 50%, 66%, 85%, 101%, and 115%.

When more than two antenna elements are used (for example: director, driven, and reflector) then the method will permute the ratios, such that every director ratio is tested against every reflector ratio. A simple example is set forth below.

The method uses the following user-configurable parameters. The first parameter is the Start Segment Number, which is an integer (e.g., in the example of Table 1) between 1 and 382 that defines the starting frequency segment.

The second parameter is the Maximum VSWR. This value is a decimal number >=1.0 and is the maximum VSWR value that will be allowed. If no VSWR measurements below this value have been collected, then a measurement with the lowest VSWR value will be used.

Long Driven—ReflectorRatio Start is a decimal number >=0 and is the starting reflector ratio when the driven element is "long" (M1 in the current embodiment).

Long Driven—ReflectorRatio End is a decimal number >=0 and is the ending reflector ratio when the driven element is "long" (M1 in the current embodiment).

Long Driven—ReflectorSample Count is an integer number >=0 and is the number of ratios to test between the start and end values. If set to 1, only the end value is used.

Short Driven—Director Ratio Start is a decimal number >=0 and is the starting director ratio when the driven element is "short" (M2 in the current embodiment).

Short Driven—Director Ratio End is a decimal number >=0 and is the ending director ratio when the driven element is "short" (M2 in the current embodiment).

Short Driven—DirectorSample Count is an integer number >=0 and is the number of ratios to test between the start and end values. If set to 1, only the end value is used.

Short Driven—ReflectorRatio Start is a decimal number >=0 and is the starting reflector ratio when the driven element is "short" (M2 in the current embodiment)

Short Driven—ReflectorRatio End is a decimal number >=0 and is the ending reflector ratio when the driven element is "short" (M2 in the current embodiment)

Short Driven—ReflectorSample Count is an integer number >=0 and is the number of ratios to test between the start and end values. If set to 1, only the end value is used.

Table 2 and Table 3 show illustrative and non-limiting examples of parameters that can be used in the methods of the present invention. Table 2 shows an example of parameters for a two-element EMC antenna.

TABLE 2

| Two Elements |
|---|
| Parameters |
| Reflector Start Ratio: 0.50 (50%) |
| Reflector End Ratio: 1.15 (115%) |
| Reflector Sample Count: 5 |
| Measured Ratios |
| R: 0.50 |
| R: 0.66 |
| R: 0.85 |
| R: 1.01 |
| R: 1.15 |

Table 3 shows an example of parameters for a three-element EMC antenna.

TABLE 3

| Three Elements | |
|---|---|
| Parameters | |
| Director Start Ratio: 0.90 (90%) | |
| Director End Ratio: 1.1 (110%) | |
| Director Sample Count: 3 | |
| Reflector Start Ratio: 0.95 (95%) | |
| Reflector End Ratio: 1.05 (105%) | |
| Reflector Sample Count: 3 | |
| Measured Ratios | |
| D: 0.90 | R: 0.95 |
| D: 1.00 | R: 0.95 |
| D: 1.10 | R: 0.95 |
| D: 0.90 | R: 1.00 |
| D: 1.00 | R: 1.00 |
| D: 1.10 | R: 1.00 |
| D: 0.90 | R: 1.05 |
| D: 1.00 | R: 1.05 |
| D: 1.10 | R: 1.05 |

The method begins at reference numeral 82. At reference numeral 84 it is determined if there are any frequency segment groups (e.g., Table 1) that remain to be tested. If not, the method proceeds to reference numeral 86 where all of the captured measurements are analyzed. The method then ends at reference numeral 88.

If at reference numeral 84 it is determined that there are frequency segment groups that remain to be tested, the method proceeds to reference numeral 90 where the next frequency group is selected. The method then proceeds to reference numeral 92 where it is determined if there is at least one relative element ratio remaining to be tested. If not, the method proceeds to reference numeral 86 where all of the captured measurements are analyzed. The method then ends at reference numeral 88.

If at reference numeral 92 it is determined that there is at least one relative element ratio remaining to be tested, the method proceeds to reference numeral 94 where the next relative element ratio is selected. The method then proceeds to reference numeral 96 where the controller issues commands to the element length controller to adjust the element lengths of the EMC antenna 38 to the next test configuration.

The method then proceeds to reference numeral 98 where it is determined whether the last element positions in the current ratio series have been reached. If not, the method then proceeds to reference numeral 100 where VSWR measurements are collected for the current configuration of element lengths. The method then proceeds to reference numeral 102, where VSWR measurements are collected for the current configuration of element lengths. Persons of ordinary skill in the art will appreciate that the processes performed at reference numerals 100 and 102 do not necessarily need to be performed in that order.

The method then proceeds to reference numeral 96 where the element lengths are again adjusted and then to where it is determined whether the last element positions in the current ratio series have been reached. If the last element positions in the current relative ratio have been reached, the method proceeds again to reference numeral 92 where it is determined if there is at least one relative element ratio remaining to be tested.

The method loops through reference numerals 84, 92, and 98 until all element lengths at all ratios for all frequency segments have been tested, the measurements analyzed and the method ends at reference numeral 88.

From an examination of FIG. 3, persons of ordinary skill in the art will note that VSWR Measurements are taken across the entire frequency span for every element position as described above. Signal strength measurements are also taken across the entire frequency span for every element position as described above. Background noise values are subtracted from the signal trace values to produce a metric describing "Signal Gain Above Background Noise". As will be appreciated by persons of ordinary skill in the art, multiple measurements may be averaged to produce a more accurate reading.

Figure 4:
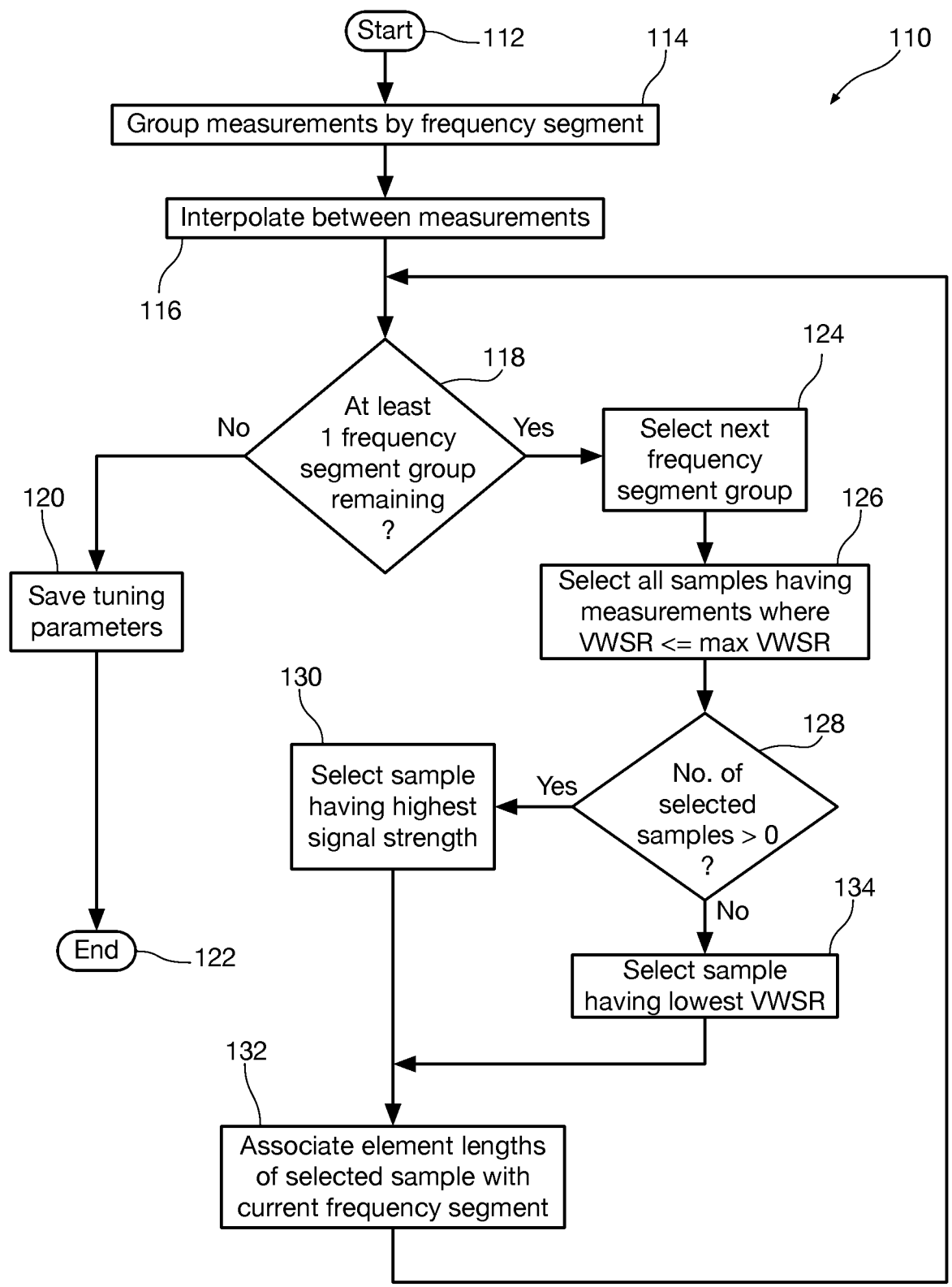
FIG. 4 is a flow diagram showing a method for performing the data analysis phase of a method in accordance with an aspect of the present invention.

Referring now to FIG. 4, a flow diagram shows a method 110 to implement an illustrative data analysis stage of the tuning procedure of the present invention. The method begins at reference numeral 112.

At reference numeral 114, the samples are separated and grouped by their respective segment groups. Persons of ordinary skill in the art will appreciate that segment groups can be defined arbitrarily and are not limited to specific frequency ranges. They are grouped only because they share the same tuning parameters. In accordance with one instance of the invention, four distinct segment groups can be defined. A first low-frequency segment group in the frequency range between 30-35 MHz uses two elements: a driven element and a reflector (M1 and M3 respectively). This group is separated out from the rest of the two-element frequency segments because it is advantageous to collect a larger number of reflector ratio samples, since it has been discovered that the reflector can have unusual lengths (e.g., 0", 50% of the driven element).

A second low-frequency segment group in the frequency range between 35-55 MHz uses two elements: a driven element and a reflector (M1 and M3 respectively). This group does not require as many ratio samples as the group above, since the reflector behaves more predictably at these frequencies.

A mid- to high-frequency group in the frequency range between 55-180 MHz uses all 3 elements: director, driven element, and reflector (M1, M2, M3). This group does not require a large number of ratio samples since the elements behave predictably in an RF chamber at this frequency range.

A high-frequency group in the frequency range between 180-200 MHz uses all three elements: director, driven element, and reflector (M1, M2, M3). This group may use yagis with elements that are 1 wavelength or 1.5 wavelengths in length, because at these high frequencies the elements of the EMC antenna can be lengthened enough to create these 1 to 1.5 wavelength antennas as opposed to the usual 0.5 wavelength antennas. Yagis made with longer elements can produce even higher field strengths in some cases, so it is separated from the other segments.

Empirical observations have shown that the elements do not have to be moved in small increments, such as 0.5 inch or 1 inch at a time because the trace data (the data collected from the spectrum analyzer after a complete sweep of the entire frequency range, the measurements of signal and SWR at multiple points across the frequency span being tested) changes very little when moving the elements a fairly long distance, perhaps as long as 5 inches or 10 inches.

Figure 6:
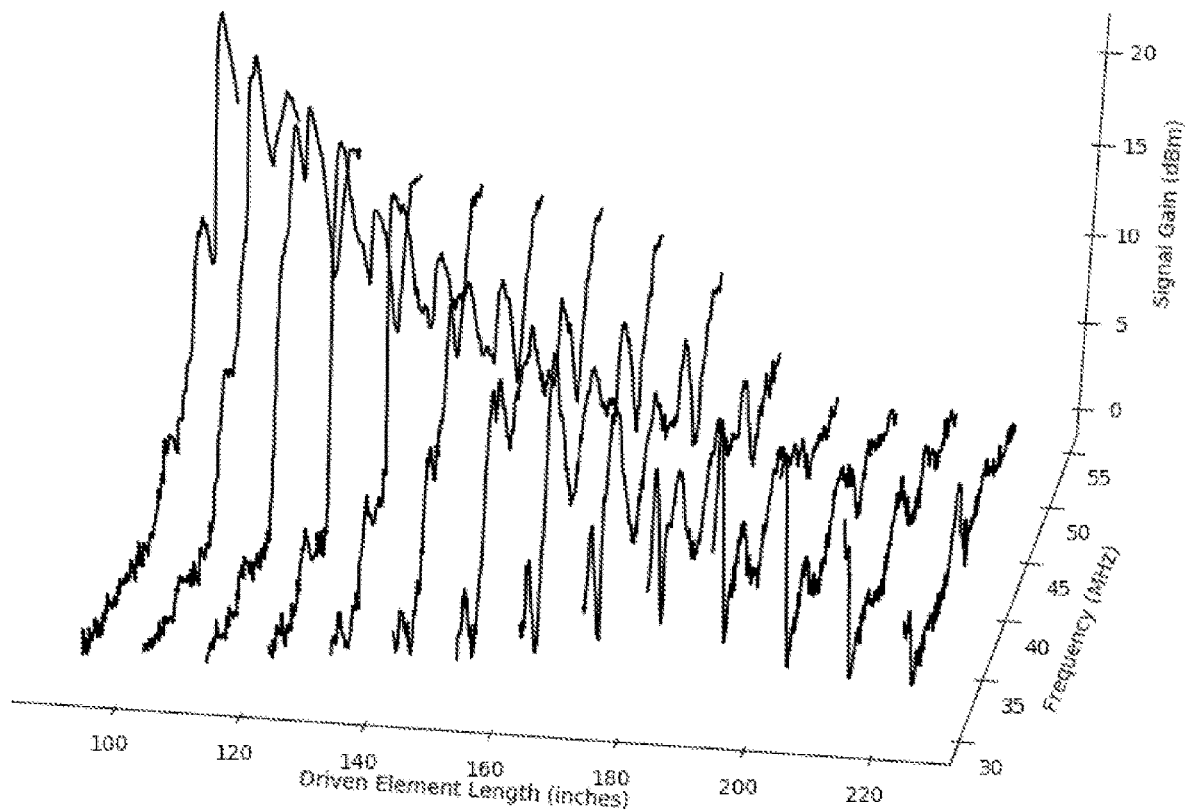
FIG. 6 is a three-dimensional graph showing signal gain as a function of frequency for an EMC antenna having a range of driven element lengths.
Figure 7:
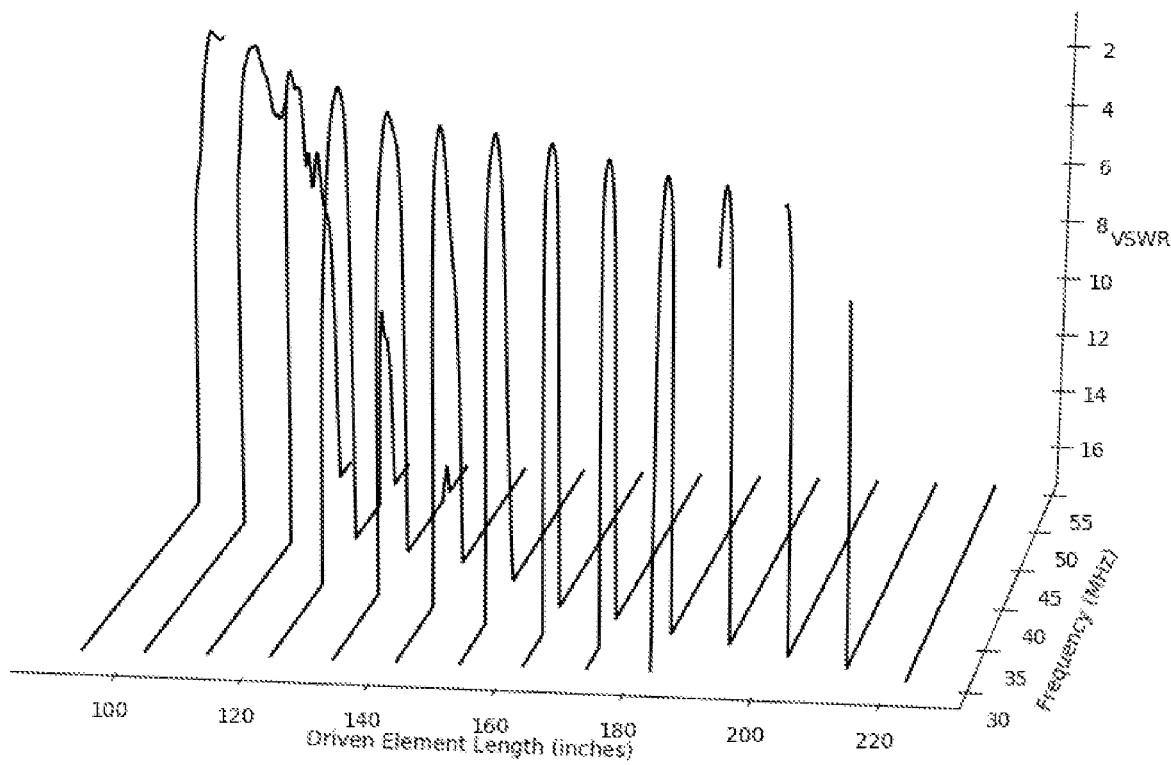
FIG. 7 is a three-dimensional graph showing VSWR as a function of frequency for an EMC antenna having a range of driven element lengths.
Figure 8:
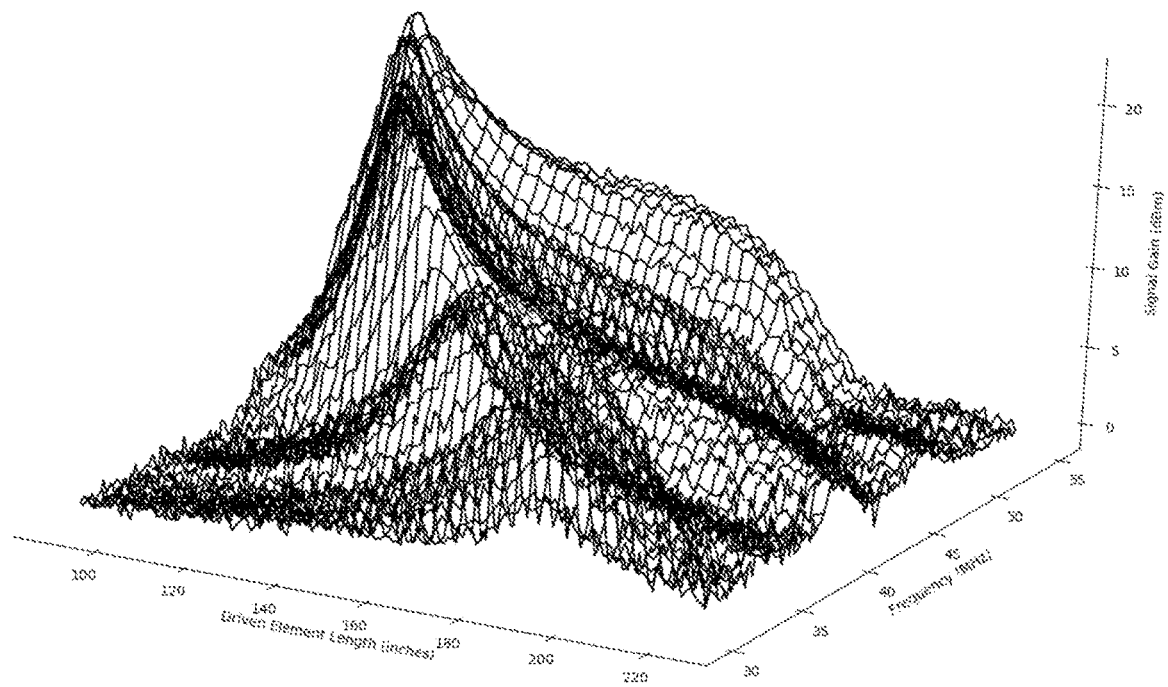
FIG. 8 is an interpolated three-dimensional graph showing signal gain as a function of frequency for an EMC antenna having a range of driven element lengths.
Figure 9:
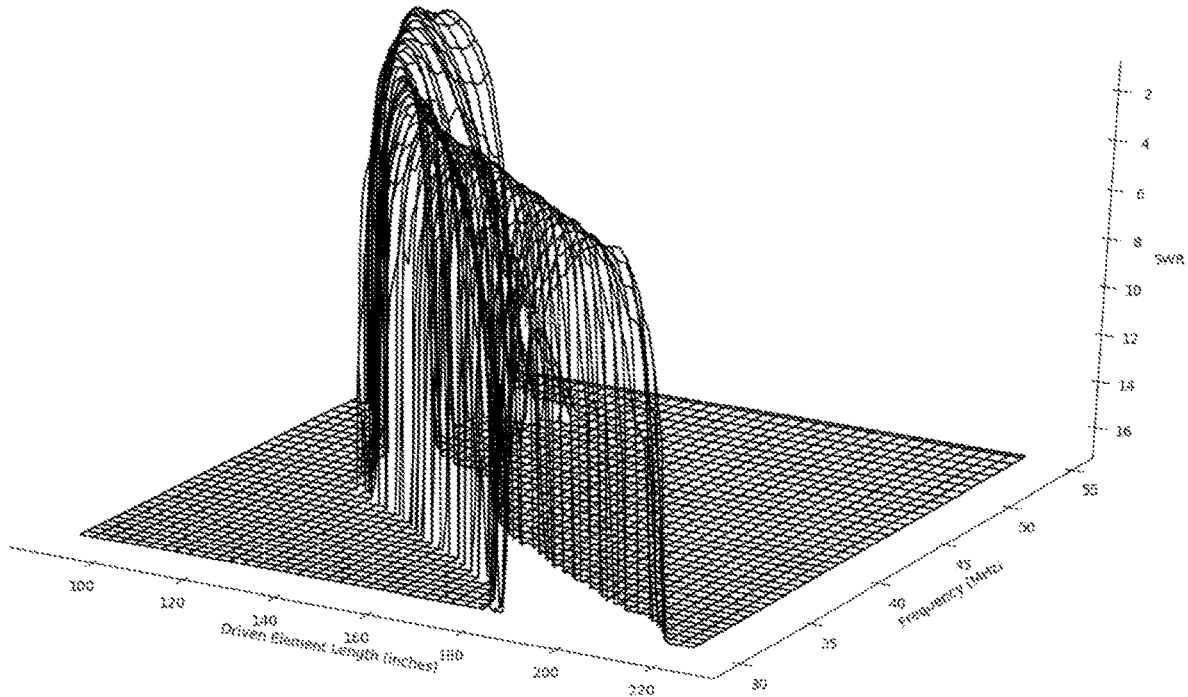
FIG. 9 is an interpolated three-dimensional graph showing VSWR as a function of frequency for an EMC antenna having a range of driven element lengths.
Figure 10:
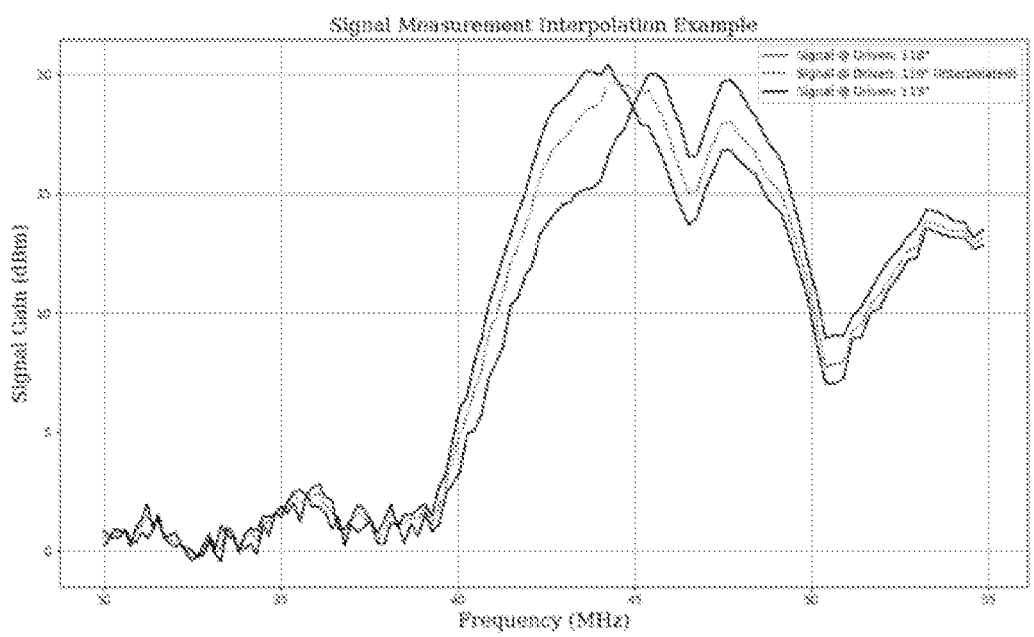
FIGS. 10 and 11 are graphs of signal gain as a function of frequency showing how interpolated signal gain data compares with actually measured signal gain data.
Figure 11:
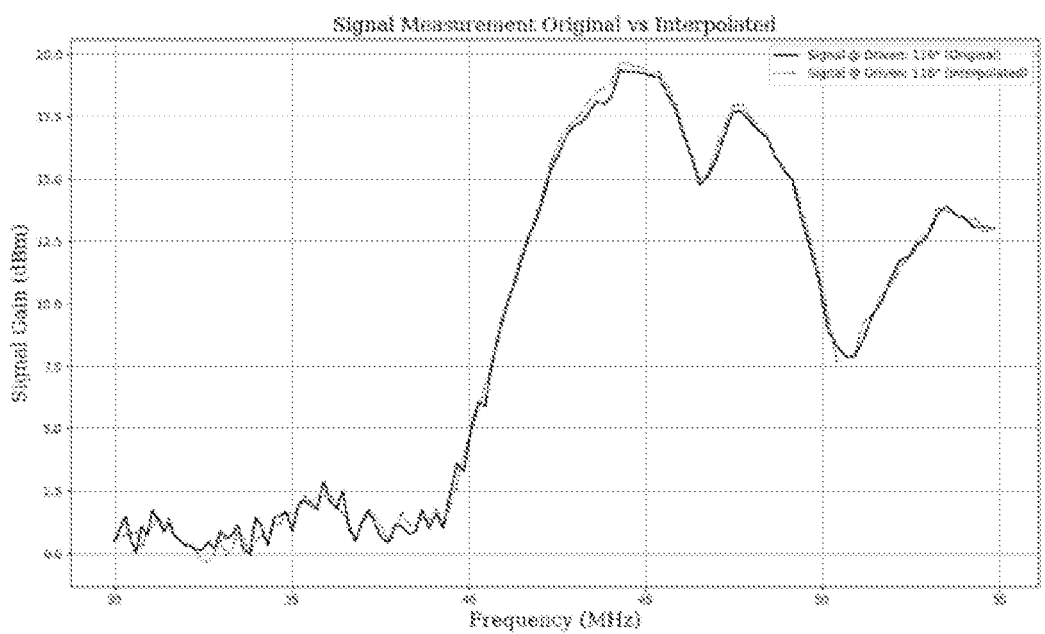

Once all the traces are collected for a particular length range, the values can be plotted in 3 dimensions, where the x-axis is frequency, the y-axis is driven element length, and the z-axis is signal strength (see FIG. 6) or VSWR (see FIG. 7). Persons of ordinary skill in the art will note that these 3-dimensional data points are collected for every "element ratio" per "segment group". A variety of 3-dimensional interpolation methods can then be used to fairly accurately approximate the values in between and create a 3-dimensional surface plot The resulting 3D surface allows the missing values to be filled in accurately as shown respectively in FIG. 8 and FIG. 9. FIG. 10 and FIG. 11 show an example of the signal trace for the 30-55 MHz frequency span, a driven element length measured once at 113 inches and again at 118 inches (length increment=5 inches). The interpolated value at 116 inches is seen as the dotted line in FIG. 10.

FIG. 11 shows how closely the interpolated data compares to actual as measured at 116 inches. FIG. 10 and FIG. 11 show that it is not necessary to take signal strength and VSWR readings at small element length increments. This observation allows greatly increasing tuning speed by relaxing the granularity of the length increments of the measurements.

In view of the above observation, the method of FIG. 4 proceeds to reference numeral 116 where the data is interpolated to provide data values for positions in between measurements. This interpolation shortens the data measurement time without appreciably degrading the quality of the data.

At reference numeral 118 it is determined whether there is at least one frequency segment group left to analyze. If not, the tuning parameters are saved at reference numeral 120 and the method ends at reference numeral 122.

If at reference numeral 118 it is determined that there is at least one frequency segment group left to analyze, the method proceeds to reference numeral 124 where the next frequency group is selected for analysis.

Figure 12:
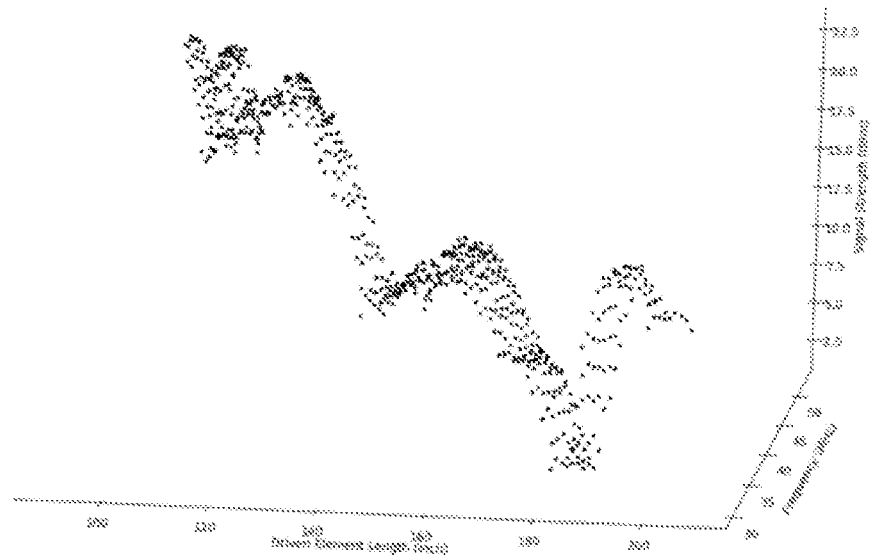
FIG. 12 is a graph showing the results of thresholding and filtering of the data.
Figure 13:
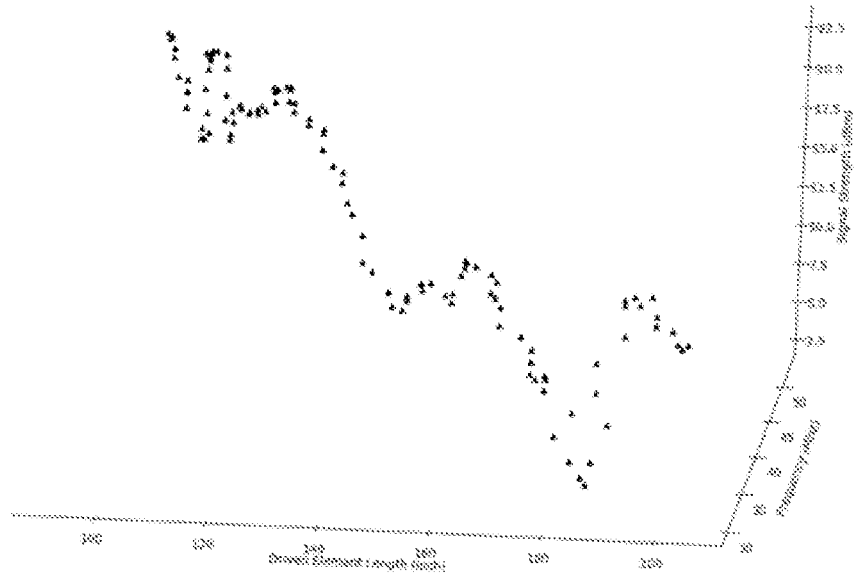
FIG. 13 is a graph showing the results of choosing the highest signal points and correlating them to the element length and frequency thresholding and filtering of the data.
Figure 14:
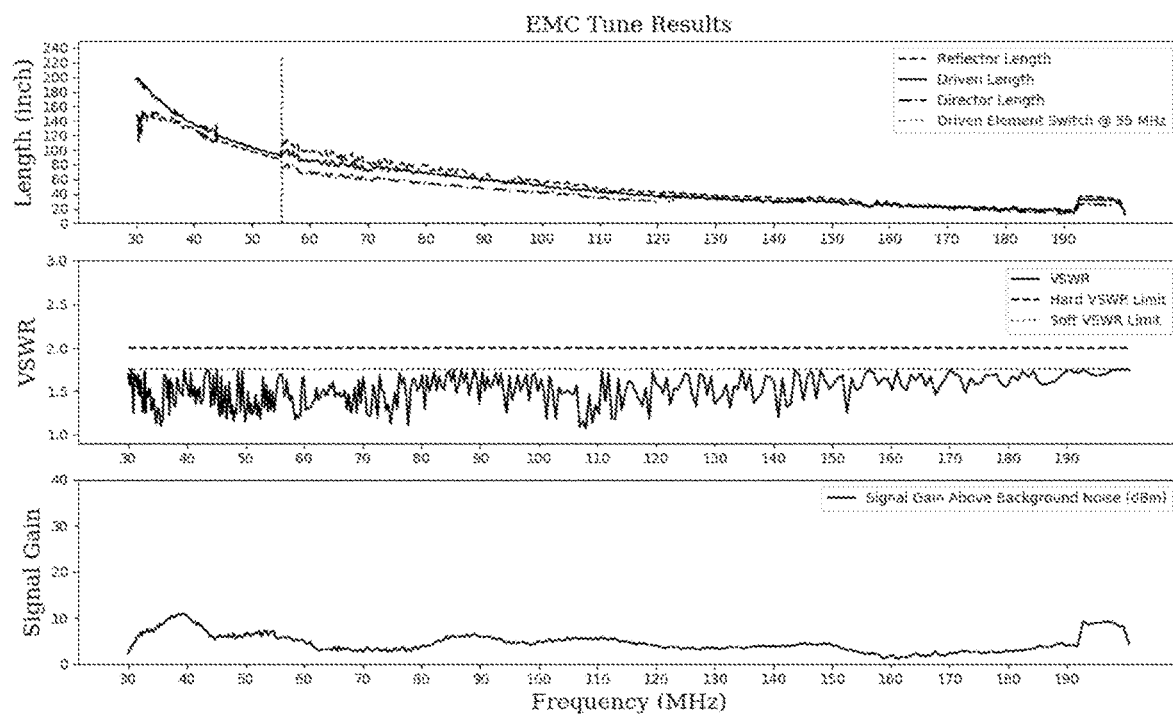
FIG. 14 and FIG. 15 are graphs of the resulting data in cartesian coordinate space, showing all segment lengths across the entire frequency span, along with the best signal and thresholded SWR value.
Figure 15:
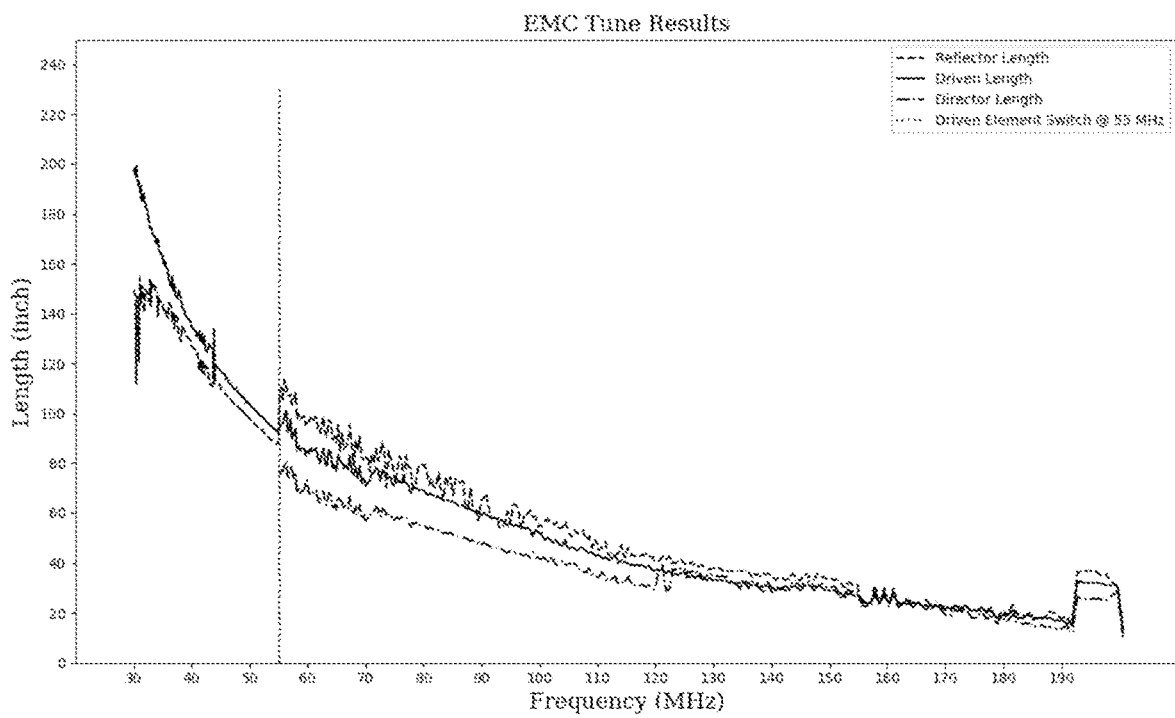

In accordance with the aspect of the invention shown in the method of claim 4, thresholding and filtering may be performed. Only the data points where VSWR<MAX_VSWR as specified by the tuning parameters are selected, while finding a single point where the signal strength is highest MAX(SIGNAL). To do this, all VSWR values that do not meet the predetermined threshold are simply filtered out, then the filtered cross-section is used to generate a set of signal strength values that fall within the filtered low VSWR region. This is illustrated graphically in FIG. 12. After thresholding and filtering the data, the highest signal points are chosen and are correlated to the element length and frequency. This is illustrated graphically in FIG. 13. This can be done over multiple 3D plots to determine the best driven length and director/reflector ratios across the frequency span. The example depicted in FIG. 13 shows analysis of a single set of measurements for a single segment group and a single element ratio. The resulting data can be graphed on a cartesian plane as shown in FIGS. 14 and 15, showing all segment lengths across the entire frequency span, along with the best signal and VSWR values below the programmed threshold value.

At reference numeral 126, all samples having measurements where the VSWR is equal to or less than the predetermined threshold are selected. The method then proceeds to reference numeral 128 where it is determined whether the number of samples selected at reference numeral 126 is greater than zero. If so, the method proceeds to reference numeral 130 where the sample having the highest measured signal strength among the selected samples is selected. The method then proceeds to reference numeral 132 where the element lengths of the selected sample are associated with the current frequency segment. The method then returns to reference numeral 118 where it is determined whether there is at least one frequency segment group left to analyze.

If at reference numeral 128 it was determined that there are no samples selected at reference numeral 126 where the VSWR is equal to or less than the predetermined threshold, the method proceeds to reference numeral 134, where the sample having the lowest VSWR is selected. The method then proceeds to reference numeral 132 where the element lengths of the selected sample are associated with the current frequency segment. The method then returns to the loop beginning at reference numeral 18 until there are no frequency segment groups left to analyze and the method ends at reference numeral 122.

Figure 5:
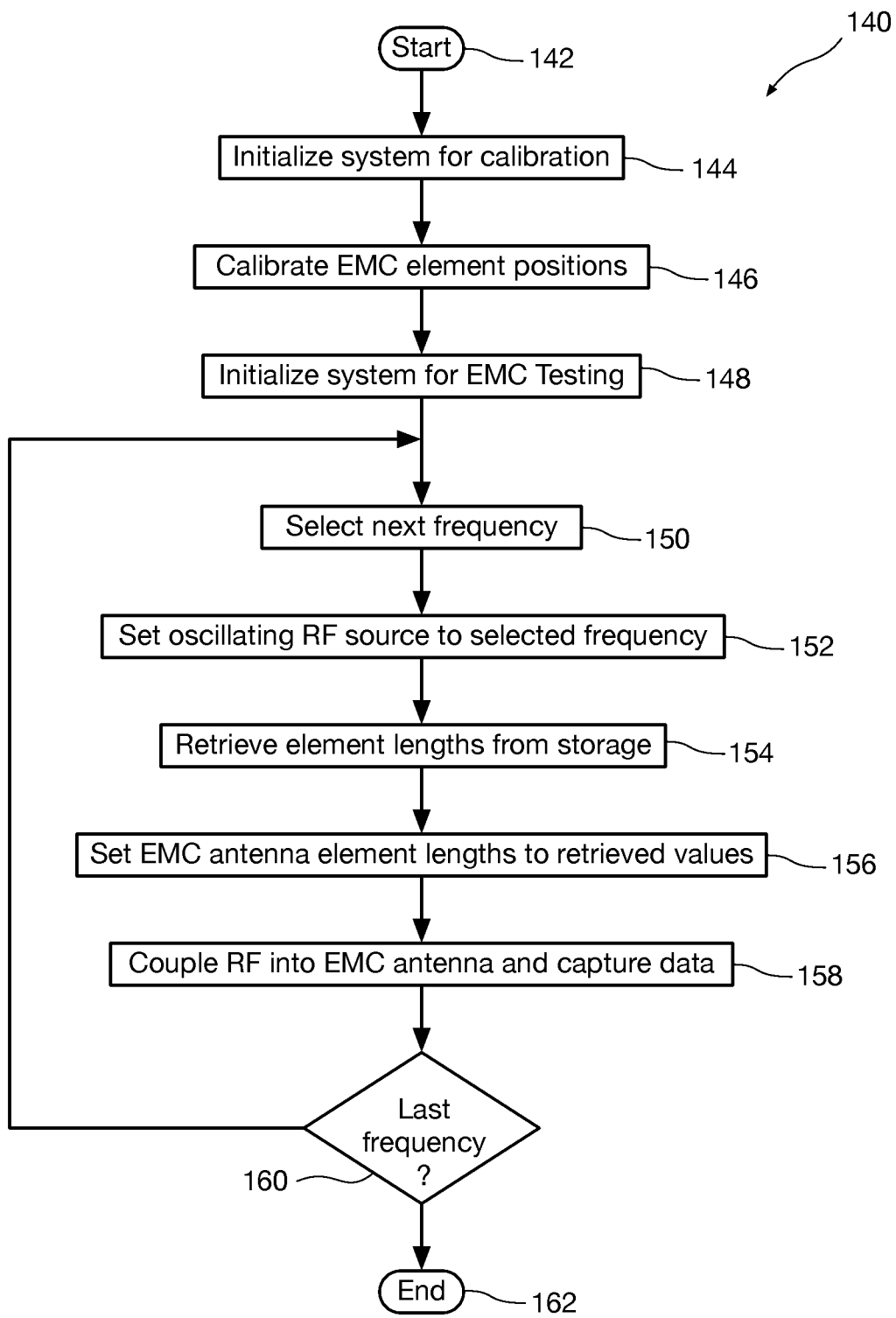
FIG. 5 is a flow diagram showing a method for operating the EMC antenna system in accordance with an aspect of the present invention.

Referring now to FIG. 5, a flow diagram shows an illustrative method 140 for an overall operation of the EMC antenna system of the present invention. The method starts at reference numeral 142.

At reference numeral 144 the system is initialized for calibration. This process is shown and described with reference to FIG. 2. At reference numeral 146 the EMC antenna elements are calibrated. This process is shown and described with reference to FIG. 3 and FIG. 4.

Once the initialization and calibration procedures of reference numerals 144 and 146 have been performed, the optimal element positions for each test frequency have been determined and stored. At this point the EMC antenna system of the present invention may be used to perform EMC testing.

At reference numeral 148 the system is initialized for EMC testing. In order to perform actual EMC testing following calibration, initializing the system for testing includes disconnecting the EMC antenna from the VSWR bridge of the VSWR measuring spectrum analyzer. The tracking generator of the spectrum analyzer in the configuration test setup depicted in FIG. 1B cannot be used with an amplifier and can only generate a weak RF signal suitable for tuning. The field probe(s) used for tuning from the field strength measuring spectrum analyzer are disconnected, and removed from the test chamber along with any connecting cables. The EMC antenna is connected to an RF amplifier that is driven by an oscillating RF signal source for the purposes of illuminating the test article at a specified power level. NIST traceable e-field probes are connected, and the desired RF susceptibility tests (RS-103, MIL-STD-461G, etc.) can be performed. The EMC antenna remains connected to the SDA100 antenna element length controller and the Raspberry Pi (or other controller).

Persons of ordinary skill in the art will appreciate that the configuration test setup shown in FIG. 1B is only one non-limiting example of a configuration test setup and that the high-power amplifier and NIST traceable probes necessary for the EMC testing can be integrated into the EMC antenna system of the present invention along with other circuit blocks that perform the functions of the configuration test setup shown in FIG. 1B to form a complete EMC antenna system, eliminating any need to switch the antenna and controller over to a different set of equipment to initialize the system to perform the EMC testing.

Once the system has been initialized for EMC testing, the next EMC test frequency is selected at reference numeral 150. The first time that the system implements reference numeral 150, it will select the first EMC test frequency. At reference numeral 152, the oscillating RF signal source is set to the selected frequency. Every time a new frequency is being tested, the equipment (amplifier, RF source, EMC antenna) are set to that specific frequency.

At reference numeral 154, the element lengths for the EMC antenna stored for the selected frequency are retrieved. At reference numeral 156 the antenna controller sets the lengths of the EMC antenna elements to the stored values for the selected EMC test frequency. At reference numeral 158 the system couples RF energy into the EMC antenna and EMC test data representing behavior of the EUT for the selected EMC test frequency is captured.

At reference numeral 160 it is determined whether the currently-selected EMC test frequency is the last EMC test frequency in the sequence. If so, the method ends at reference numeral 162. If at reference numeral 160 it is determined that the currently-selected EMC test frequency is not the last EMC test frequency in the sequence, the method returns to reference numeral 150 where the next EMC test frequency is selected. The method loops through reference numeral 150 to reference numeral 160 until EMC test data for all of the EMC test frequencies in the sequence has been captured, after which the method ends at reference numeral 162.

Persons of ordinary skill in the art will appreciate that the implementation described herein can be further optimized for speed by applying Machine Learning techniques.

One possible way to achieve this is to collect a large number of trace data measurements at pre-selected points of interest (e.g., specific element length positions). This would have to be done in varying environments, for example by receiving anonymous analytics from customer usage.

The "specific element positions" used as input into the machine learning model would need to be determined by analyzing all trace segments and determining which ones exhibit the most variation and therefore exerting the largest effect on the remaining measurements.

Once enough data samples have been collected (e.g., 1000 or more), a machine learning model can be trained to predict the best lengths given only a few data points as input. This approach can result in extremely fast tune times.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for operating an electromagnetic compatibility (EMC) testing system comprising:
   providing in an EMC test chamber an EMC antenna having a plurality of length-adjustable elements one of which is a driven element;
   selecting a plurality of frequencies within an EMC testing frequency range;
   separately for each of the plurality of selected frequencies, adjusting individually incrementally the lengths of each of the plurality of length-adjustable elements for selected combinations of length ratios between the driven element and other ones of the plurality of length-adjustable elements, including combinations of length ratios where the driven element is longer than the other ones of the plurality of length-adjustable elements;
   separately for each of the incremental lengths of each of the plurality of length-adjustable elements in the selected combinations of length ratios and for each of the plurality of selected frequencies, driving RF energy at the selected frequency at a calibration power level into the driven element of the EMC antenna and measuring VSWR and signal strength;
   separately for each of the plurality of selected frequencies, selecting and storing in a table a one of the incremental lengths at a one of the selected combinations of length ratios having one of the lowest VSWR and a VSWR lower than a threshold value that exhibits a highest signal strength;
   placing an equipment under test in the EMC test chamber;
   separately for each of the plurality of selected frequencies:
      adjusting individually the lengths of each of the plurality of length-adjustable elements to the selected and stored lengths;
      driving RF energy at the selected frequency at a EMC test power level into the driven element of the EMC antenna to generate an e-field in the equipment under test; and
      measuring behavior of the equipment under test in the presence of the e-field.

2. The method of claim 1 wherein selecting a plurality of frequencies within the EMC testing frequency range comprises selecting a plurality of frequencies between 30 MHz and 200 MHz.

3. The method of claim 1 wherein adjusting individually incrementally the lengths of each of the plurality of length-adjustable elements comprises adjusting individually the lengths of each of the plurality of length-adjustable elements by increments of between about 1 inch and about 10 inches.

4. The method of claim 1 wherein adjusting individually incrementally the lengths of each of the plurality of length-adjustable elements comprises adjusting individually the lengths of each of the plurality of length-adjustable elements by increments of 1 inch.

5. The method of claim 1 wherein adjusting individually incrementally the lengths of each of the plurality of length-adjustable elements comprises adjusting individually the lengths of each of the plurality of length-adjustable elements by increments of 5 inches.

6. The method of claim 1 wherein the plurality of length-adjustable elements includes a driven element and a reflector.

7. The method of claim 6 wherein the selected combinations of length ratios between the driven element and the reflector is 0.50, 0.66, 0.85, 1.01, and 1.15.

8. The method of claim 1 wherein the plurality of length-adjustable elements includes a director, a driven element and a reflector.

9. The method of claim 8 wherein:
with the length ratio between the driven element and the reflector at 0.95 and the selected combinations of length ratios between the driven element and the director is 0.90, 1.00, and 1.10;
with the length ratio between the driven element and the reflector at 1.00 and the selected combinations of length ratios between the driven element and the director is 0.90, 1.00, 1.10; and
with the length ratio between the driven element and the reflector at 1.05 and the selected combinations of length ratios between the driven element and the director is 0.90, 1.00, 1.10.

10. The method of claim 1 wherein driving RF energy at the selected frequency at a calibration power level into the driven element of the EMC antenna comprises driving RF energy at the selected frequency into the driven element of the EMC antenna at less than about 1 watt to about 100 watts.

11. The method of claim 1 wherein driving RF energy at the selected frequency at a EMC test power level into the driven element of the EMC antenna comprises driving RF energy at the selected frequency into the driven element of the EMC antenna at about 400 watts to about 2,000 watts.

12. The method of claim 1 further comprising augmenting element length data stored in the table by interpolating adjacent element length values.

13. An electromagnetic compatibility (EMC) testing system comprising:
an EMC antenna having a plurality of length-adjustable elements one of which is a driven element;
an antenna element length controller that adjusts individually incrementally the lengths of each of the plurality of length-adjustable elements for selected combinations of length ratios between the driven element and other ones of the plurality of length-adjustable elements, including combinations of length ratios where the driven element is longer than the other ones of the plurality of length-adjustable elements;
a circuit for driving into the EMC antenna RF energy at a plurality of frequencies at a calibration power level within an EMC testing frequency range separately for each of the incremental lengths of each of the plurality of length-adjustable elements in the selected combinations of length ratios and for each of the plurality of selected frequencies and for measuring VSWR and signal strength;
a controller configured to:
select and store in a table a one of the incremental lengths at a one of the selected combinations of length ratios having one of the lowest VSWR and a VSWR lower than a threshold value that exhibits a highest signal strength at each of the frequencies;
separately for each of the plurality of selected frequencies adjust individually the lengths of each of the plurality of length-adjustable elements to the selected and stored lengths, drive RF energy at the selected frequency at a EMC test power level into the driven element of the EMC antenna to generate an e-field in the equipment under test, and measure behavior of the equipment under test in the presence of the e-field.

14. The EMC testing system of claim 13 wherein the EMC antenna has two length-adjustable elements.

15. The EMC testing system of claim 13 wherein the EMC antenna has three length-adjustable elements.

16. The EMC testing system of claim 13 wherein the controller is further configured to drive an oscillating RF signal source to one of the calibration power level and the EMC test power level.

17. The EMC testing system of claim 16 wherein the oscillating RF signal source includes an amplifier and the controller is configured to disable the amplifier to drive the oscillating RF signal source to the calibration power level and to enable the amplifier to drive the oscillating RF signal source to the EMC test power level.

* * * * *